United States Patent
Chino et al.

(10) Patent No.: US 6,449,298 B1
(45) Date of Patent: Sep. 10, 2002

(54) SEMICONDUCTOR LASER DEVICE AND METHOD FOR FABRICATING THE SAME

(75) Inventors: Toyoji Chino; Toshiyuki Tarizawa, both of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/316,178

(22) Filed: May 21, 1999

(30) Foreign Application Priority Data

Jun. 23, 1998 (JP) .......................................... 10-175527

(51) Int. Cl.$^7$ ............................................... H01S 5/065
(52) U.S. Cl. ........................................... 372/45; 372/46
(58) Field of Search ..................... 372/45, 46

(56) References Cited

U.S. PATENT DOCUMENTS

| | | | |
|---|---|---|---|
| 4,977,568 A | * 12/1990 | Yamamoto et al. | 372/46 |
| 5,568,501 A | * 10/1996 | Otsuka et al. | 372/46 |
| 5,717,710 A | * 2/1998 | Miyazaki et al. | 372/50 |
| 5,856,207 A | * 1/1999 | Otsuka et al. | 438/41 |
| 6,028,875 A | * 2/2000 | Knight et al. | 372/46 |

OTHER PUBLICATIONS

M. Itoh et al., "High–Quality 1.3–$\mu$m GaInAsP–BH–Lasers Fabricated by MOVPE and Dry–Etching Technique", IEEE Photonics Technology Letters, vol. 8, No. 8, pp. 989–991, Aug. 1996.

R. Bhat et al., "Orientaion dependence of S, Zn, Si, Te, and Sn doping in OMCVD growth of InP and GaAs: application to DH lasers and lateral p–n junction arrays grown on non–planar substrates" Journal of Crystal Growth 107, pp. 772–778, 1991.

* cited by examiner

*Primary Examiner*—Paul Ip
*Assistant Examiner*—Jeffrey N Zahn
(74) *Attorney, Agent, or Firm*—Eric J. Robinson; Nixon Peabody LLP

(57) ABSTRACT

A striped region with a convex cross section is formed as a laser resonant cavity on an n-type InP substrate. The lower part of the striped region includes an n-type InP cladding layer and an n-type InGaAsP first waveguide layer, which are stacked in this order on the substrate. The upper part of the striped region includes an InGaAsP active layer, a p-type InGaAsP second waveguide layer and a p-type InP cladding layer, which are stacked in this order on the first waveguide layer. The striped region extends along the zone axis, or in the [011] direction. The sides of the upper striped region have a crystallographic plane orientation (0–11), while the sides of the lower striped region have a crystallographic plane orientation (1–11)B.

16 Claims, 7 Drawing Sheets

US 6,449,298 B1

SEMICONDUCTOR LASER DEVICE AND METHOD FOR FABRICATING THE SAME

BACKGROUND OF THE INVENTION

The present invention relates to a buried heterostructure semiconductor laser device (BH-LD).

A prior art BH-LD may be fabricated by any of various techniques. The shape of a resulting striped region, including an active layer, differs depending on what technique is specifically employed. In a conventional BH-LD exemplified below, a striped region is formed by dry-etching, and then semiconductor layers are re-grown over the striped region by a metalorganic vapor phase epitaxy (MOVPE) process to bury the striped region therein. Such a BH-LD is described in IEEE Photonics Technology Letters Vol. 8 (1996), pp. 989–991, for example.

Hereinafter, the conventional BH-LD disclosed in this prior art reference will be described with reference to FIG. 7.

FIG. 7 illustrates a cross section of the BH-LD taken vertically to the direction in which the striped region thereof extends. The BH-LD is fabricated in the following manner. First, as shown in FIG. 7, epitaxial layers, namely, n-type InGaAsP first waveguide layer 102, InGaAsP active layer 103, p-type InGaAsP second waveguide layer 104 and p-type InP cladding layer 105 are grown in this order by MOVPE, for example, on an n-type InP substrate 101. Next, a striped mask pattern (not shown) is formed on the upper surface of the uppermost epitaxial layer. Then, these epitaxial layers are dry-etched with a mixed gas of methane and hydrogen using the mask pattern as an etching mask, thereby forming a striped region 106 including the active layer 103.

Then, respective burying layers, namely, p-type InP current blocking layer 107, n-type InP current blocking layer 108, p-type InP semiconductor layer 109 and p-type InGaAsP contact layer 110 are grown in this order over the substrate 101 by MOVPE again so as to cover the striped region 106.

Subsequently, p- and n-side electrodes 111 and 112 are formed by an evaporation technique on the upper surface of the p-type contact layer 110 and on the back of the substrate 101, respectively. The p-side electrode 111 is made up of Au and Zn layers alternately stacked, while the n-side electrode 112 is made up of Au and Sn layers alternately stacked.

The conventional BH-LD, however, has the following drawbacks.

Firstly, each side face of the striped region 106 has a substantially uniform crystallographic plane orientation defined between (0–11)B and (1–11)B, and receives some damage caused by the dry-etching during the re-growth process for burying the striped region 106 in the epitaxial layers. Thus, in such a structure, a p-type dopant (e.g., Zn), introduced into these burying layers during their growth on the sides of the striped region 106, is more likely to diffuse over a distance of about 0.2 μm and ultimately reach the active layer 103. In such a case, the long-term reliability of the laser device is seriously affected. It should be noted that a Miller index with a negative sign is supposed to represent a negative direction index in this specification.

Secondly, in the conventional BH-LD, the sides of the striped region 106 are subjected to some surface treatment, like wet etching, to suppress the diffusion of the dopant and thereby ensure long-term reliability. However, since the surface treatment is conducted, the width of the active layer 103, greatly affecting the electrical and optical characteristics of the device, deviates from that defined by the mask.

SUMMARY OF THE INVENTION

An object of the present invention is ensuring long-term reliability for a buried heterostructure semiconductor laser device.

To achieve this object, according to the present invention, the side faces of at least one semiconductor layer under an active layer in a striped region have a crystallographic plane orientation defined as (h–11)B, where h is an integer equal to or larger than 1.

Specifically, a first exemplary semiconductor laser device according to the present invention includes: a striped region formed on a substrate; and a plurality of burying semiconductor layers formed on the sides and upper surface of the striped region. The striped region includes lower and upper striped regions. The lower striped region includes a first waveguide layer, while the upper striped region includes an active layer and a second waveguide layer formed on the active layer. The sides of the upper striped region have a plane orientation approximately represented as (0–11) and the sides of the lower striped region have a plane orientation approximately represented as (h–11)B, where h is an integer equal to or larger than 1.

In the first semiconductor laser device, the sides of the lower striped region have a plane orientation approximately represented as (h–11)B. Thus, while the striped region is being buried in the semiconductor layers, crystals are growing mainly in a direction defined between [1–11]B and [100] on the sides of the lower striped region. Thus, crystals also grow in a similar direction on the sides of the upper striped region, too.

In Journal of Crystal Growth, Vol. 107, (1991), pp. 772–778, it is reported that Zn, or a typical p-type dopant, diffuses toward crystals much less in the (h–11)B plane than in the (h–11)A plane (where h is an integer equal to or larger than 1). In the semiconductor laser device of the present invention, the sides of the striped region to be buried in the semiconductor layers have a crystallographic plane orientation defined between (1–11)B and (100). Accordingly, it is possible to minimize the diffusion of the dopant from the burying layers toward the striped region including the active layer, thus preventing the diffusing dopant from deteriorating the active layer. As a result, improved long-term reliability can be easily ensured for the device.

A second exemplary semiconductor laser device according to the present invention includes: a striped region formed on a substrate; and a plurality of burying semiconductor layers formed on the sides and upper surface of the striped region. The striped region includes lower and upper striped regions. The lower striped region includes a first waveguide layer, while the upper striped region includes an active layer and a second waveguide layer formed on the active layer. The sides of the upper striped region have a plane orientation approximately represented as (h–11)B, where h is an integer equal to or larger than 1. The sides of the lower striped region have a plane orientation approximately represented as (j–11)B, where j is also an integer equal to or larger than 1.

In the second semiconductor laser device, the sides of the upper striped region have a plane orientation approximately represented as (h–11)B and the sides of the lower striped region have a plane orientation approximately represented as (j–11)B. Accordingly, it is possible to minimize the diffusion of the dopant from the burying layers toward the striped region including the active layer. As a result, improved long-term reliability can be easily ensured for the device.

In one embodiment of the present invention, a region under the striped region may be of a first conductivity type.

The burying layers may include first and second semiconductor layers, which are formed in this order on the sides of the striped region. The first semiconductor layer may be undoped and the second semiconductor layer may be of a second conductivity type.

In such an embodiment, it is possible to prevent the dopant of the second conductivity type in the second semiconductor layer from diffusing toward the striped region with more certainty.

In another embodiment, a dopant concentration in the second semiconductor layer preferably has such a profile that a concentration in a region of the second semiconductor layer is lower than that in another region of the second semiconductor layer, where the former region is closer to the first semiconductor layer than the latter region is.

In such an embodiment, the dopant of the second conductivity type in the second semiconductor layer is even less likely to diffuse toward the striped region.

In still another embodiment, a region under the striped region may be of a first conductivity type. The burying layers may include first and second semiconductor layers, which are formed in this order on the sides of the striped region. The first semiconductor layer may be undoped, while the second semiconductor layer may be of the first conductivity type.

In such an embodiment, since the sides of the striped region are covered with the first semiconductor layer of the first conductivity type, it is possible to prevent the dopant of the second conductivity type in the second semiconductor layer from diffusing toward the striped region with more certainty.

In still another embodiment, a region under the striped region may be of a first conductivity type. The burying layers may include first and second semiconductor layers, which are formed in this order on the sides of the striped region. The first semiconductor layer may be of a second conductivity type, while the second semiconductor layer may be of the first conductivity type.

In such an embodiment, the first and second semiconductor layers function as respective carrier blocking layers with a lot more certainty.

In still another embodiment, a region under the striped region may be of a first conductivity type. The burying layers may include first and second semiconductor layers, which are formed in this order on the sides of the striped region. The first semiconductor layer may be of the first conductivity type, while the second semiconductor layer may be of a second conductivity type.

In still another embodiment, a region under the striped region may be of a first conductivity type. The burying layers may include first and second semiconductor layers, which are formed in this order on the sides of the striped region. The first and second semiconductor layers may be of a second conductivity type. The first semiconductor layer preferably has a dopant concentration lower than that of the second semiconductor layer.

In such an embodiment, it is possible to prevent the dopant of the second conductivity type in the second semiconductor layer from diffusing toward the striped region with certainty. In addition, the first and second semiconductor layers can block the carriers of the first conductivity type with a lot more certainty.

A method for fabricating a semiconductor laser device according to the present invention includes the steps of: a) forming striped-region-forming layers by depositing a first waveguide layer, an active layer and a second waveguide layer in this order on a substrate; b) forming an upper striped region including the active layer by selectively forming a striped mask pattern on the striped-region-forming layers and then etching anisotropically the striped-region-forming layers using the mask pattern in such a manner as to expose both sides of the active layer; c) forming a lower striped region, including the first waveguide layer, under the upper striped region and along the sides of the upper striped region by etching the striped-region-forming layers as well as the upper striped region using the mask pattern, the sides of the lower striped region having a plane orientation approximately represented as (h–11)B, where h is an integer equal to or larger than 1; and d) forming a plurality of semiconductor layers over the substrate to bury the upper and lower striped regions therein.

In the method according to the present invention, the upper striped region, including the active layer, and the lower striped region, including the first waveguide layer, with a plane orientation approximately represented as (h–11)B (where h is an integer equal to or larger than 1) on the sides thereof, are formed. Then, a plurality of semiconductor layer are formed over the substrate to bury the upper and lower striped regions therein. Thus, crystals are growing mainly in a direction defined between [111]B and [100] on the sides of the lower striped region. Accordingly, crystals also grow in a similar direction on the sides of the upper striped region, too. As a result, the first semiconductor laser device of the present invention can be fabricated with certainty.

In one embodiment, the method of the present invention preferably further includes the step of selectively wet-etching the upper and lower striped regions to substantially equalize the plane orientations on the sides of the upper and lower striped regions with each other between the steps c) and d).

In such an embodiment, the second semiconductor laser device of the present invention can be fabricated with certainty.

DESCRIPTION OF THE PREFERRED EMBODIMENTS

Embodiment 1

Hereinafter, a first exemplary embodiment of the present invention will be described with reference to the accompanying drawings.

Figure 1:
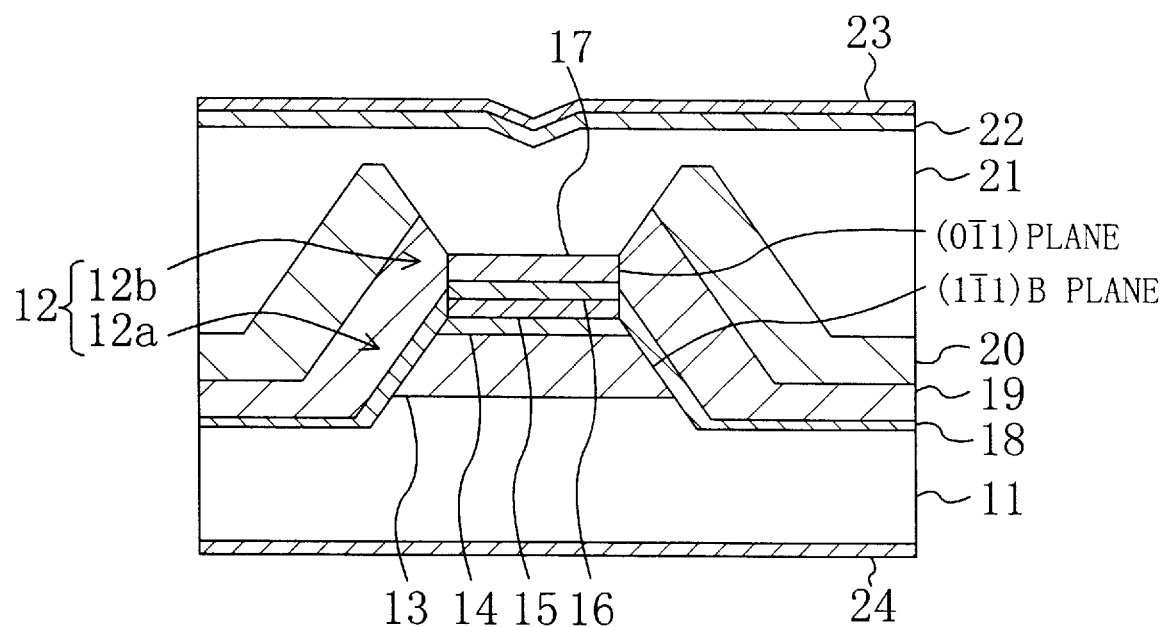
FIG. 1 is a cross-sectional view illustrating a structure of a buried heterostructure semiconductor laser device according to a first embodiment of the present invention.

FIG. 1 illustrates a cross-sectional structure of a buried heterostructure semiconductor laser device (BH-LD) according to the first embodiment of the present invention. As shown in FIG. 1, a striped region 12 with a convex cross section is formed as a laser resonant cavity on an n-type InP substrate 11. The striped region 12 consists of lower and upper striped regions 12a and 12b.

The lower striped region 12a includes an n-type InP cladding layer 13 and an n-type InGaAsP first waveguide layer 14, which are stacked in this order on the substrate 11. The upper striped region 12b includes an InGaAsP active layer 15, a p-type InGaAsP second waveguide layer 16 and a p-type InP cladding layer 17, which are stacked in this order on the first waveguide layer 14.

The striped region 12 is formed along the zone axis, i.e., in the [011] direction, or the direction coming out of the paper in FIG. 1. On both end facets of the striped region 12, crystals are cleaved. The sides of the upper striped region 12b have a plane orientation approximately represented as (0–11), while those of the lower striped region 12a has a plane orientation approximately represented as (1–11)B. The length of the striped region 12 is ordinarily in the range from 200 μm to 1.5 mm. The width of the striped region 12 is defined by that of the active layer 15. If the active layer is a multiple quantum well of InGaAsP, then the width of the striped region 12 is in the range from about 0.5 μm to about 2 μm. The height of the striped region 12 is ordinarily about 2 μm. If the active layer 15 is a multiple quantum well of InGaAsP, then the height of the striped region 12 is in the range from about 1.5 μm to about 3 μm.

The sides of the striped region 12 are sequentially buried with first, second and third burying layers 18, 19 and 20. The first burying layer 18 (i.e., the first semiconductor layer as defined in the claims) is made of undoped InP with a thickness ranging from about 10 nm to about 0.5 μm. The second burying layer 19 (i.e., the second semiconductor layer as defined in the claims) is made of p-type InP (doped with Zn, for example) with a thickness ranging from about 0.5 μm to about 1 μm. And the third burying layer 20 is made of n-type InP (doped with Si, for example) with a thickness ranging from about 0.5 μm to about 1 μm.

The upper surface of the striped region 12, as well as the second and third burying layers 19 and 20, is entirely buried in a p-type InP fourth burying layer 21 with a thickness of about 2 μm. And a p-type InGaAs contact layer 22 with a thickness of about 0.5 μm is further deposited on the upper surface of the fourth burying layer 21.

A p-side electrode 23, in which plural pairs of Pt and Ti layers are alternately stacked, is formed on the upper surface of the contact layer 22. And an n-side electrode 24, in which plural pairs of Au and Sn layers are alternately stacked, is formed on the back of the substrate 11.

The sides of the lower striped region 12a are (1–11)B planes. Thus, the first, second and third burying layers 18, 19 and 20 also grow on the sides of the lower striped region 12a in the [1–11]B direction. Furthermore, crystals grow faster in the [1–11]B direction than in the [0–11] direction. Accordingly, in the first burying layer 18 grown on the sides of the active layer 15 in the upper striped region 12b, crystals initially grow in the [0–11] direction to a certain extent and then are affected by the crystals growing on the sides of the lower striped region 12a in the [1–11]B direction. Therefore, the former crystals ultimately grow in the [1–11]B direction. Similarly, in the second burying layer 19 growing on the sides of the second waveguide layer 16 and the p-type InP cladding layer 17 in the upper striped region 12b, crystals initially grow in the [0–11] direction to a certain extent and then are affected by the crystals growing on the sides of the active layer 15 in the [1–11]B direction. Finally, the former crystals also grow in the [1–11]B direction.

In this embodiment, the p-type dopant also diffuses during a heat treatment for growing the burying layers. However, the sides of the active layer 15 and those of the first and second waveguide layers 14 and 16, sandwiching the active layer 15 in the direction vertical to the substrate 11, are buried in the burying layers with a plane orientation (1–11)B. Accordingly, the p-type dopant, e.g., Zn, is less likely to diffuse inward from those side faces of the striped region 12.

Furthermore, since the first burying layer 18 is undoped, the concentration of Zn decreases in this layer 18. In other words, since the diffusion distance of Zn can be shortened, Zn is even less likely to reach the sides of the striped region 12.

Since the dopant is less likely to diffuse from the second burying layer 19 toward the active layer 15, a BH-LD excellent in long-term reliability can be formed with a lot more certainty.

In this embodiment, the first burying layer 18 is undoped. Alternatively, the first burying layer 18 may be made of n-type InP preferably with a thickness of 0.5 μm or less. In such a case, the diffusion of the p-type dopant toward the active layer 15 can be further suppressed.

As another alternative, the first burying layer 18 may be made of n-type InP with a thickness of 0.5 μm or less. And the second burying layer 19 may have a two-layered structure consisting of: a p-type lightly doped layer, which is closer to the first burying layer 18; and a p-type heavily doped layer, which is closer to the third burying layer 20.

Also, since the sides of the striped region 12 are buried in the burying layers with a plane orientation (1–11)B, the first burying layer 18 may be a p-type InP lightly doped layer. In such a case, the first burying layer 18 can block n-type carriers (i.e., electrons) with a lot more certainty.

Alternatively, the first burying layer 18 may be either undoped or made of p-type InP and the second burying layer 19 may be made of n-type InP, since the sides of the striped region 12 are buried in the burying layers with a plane orientation (1–11)B.

In the foregoing embodiment, the sides of the lower striped region 12a are supposed to have a plane orientation (1–11)B. Alternatively, the sides may be crystallographic planes with a plane orientation (2–11)B, (3–11)B, etc., which is defined between (1–11)B and (100). This is because the dopant is less likely to diffuse from the second burying layer 19 toward the striped region 12 in a direction defined by such a B-plane with any of these plane orientations than in any other direction.

Hereinafter, a method for fabricating the BH-LD with such a structure will be described with reference to FIGS. 2(a), 2(b), 2(c) and 2(d) and FIGS. 3(a) and 3(b).

Figure 2A:
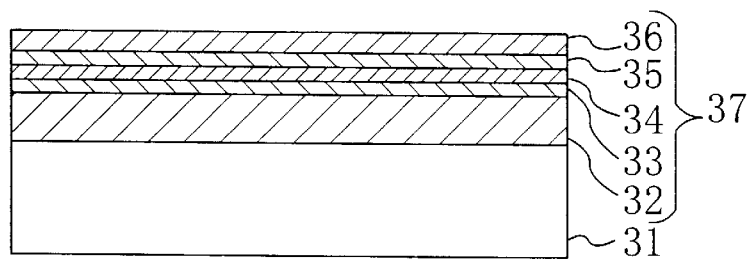
FIGS. 2(a), 2(b), 2(c) and 2(d) are cross-sectional views illustrating respective process steps for fabricating the buried heterostructure semiconductor laser device of the first embodiment.

FIGS. 2(a) through 2(d) and FIGS. 3(a) and 3(b) illustrate respective cross-sectional structures corresponding to the individual process steps for fabricating the BH-LD of the first embodiment. First, as shown in FIG. 2(a), n-type InP cladding layer 32, n-type InGaAsP first waveguide layer 33, InGaAsP active layer 34, p-type. InGaAsP second waveguide layer 35 and p-type InP cladding layer 36 are grown in this order by MOVPE, for example, on the principal surface of an n-type InP substrate 31 with a plane orientation (100). As a result, striped-region-forming layers 37, consisting of the n-type cladding layer 32, first waveguide layer 33, active layer 34, second waveguide layer 35 and p-type cladding layer 36, are formed.

Figure 2B:
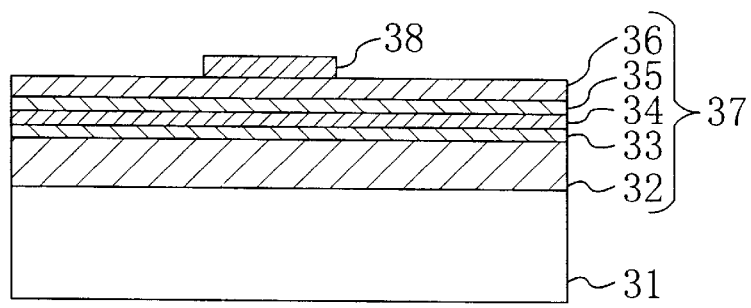

Next, as shown in FIG. 2(b), a mask pattern 38 made of a dielectric such as $SiO_2$ with a plurality of stripes extending along the zone axis, or in the [011] direction, is selectively formed on the upper surface of the striped-region-forming layers 37.

Figure 2C:
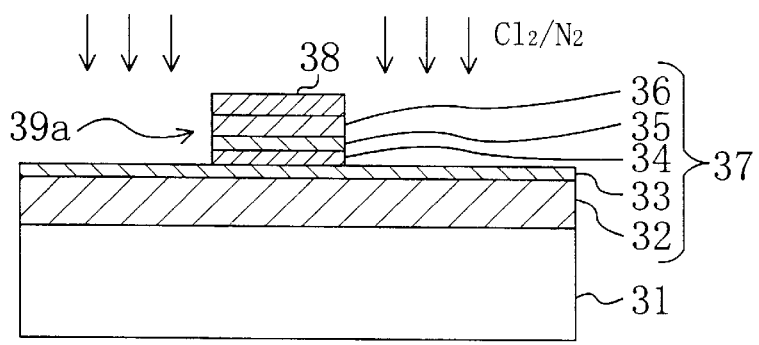

Subsequently, as shown in FIG. 2(c), the striped-region-forming layers 37 are subjected to a reactive ion etching (RIE) process using the mask pattern 38, thereby exposing the first waveguide layer 33 out of the striped-region-forming layers 37. The RIE process is performed under the conditions that a flow rate ratio of chlorine ($Cl_2$) gas to nitrogen ($N_2$) gas is 3:1, the pressure is in the range from 1 mTorr to 2 mTorr and the accelerating voltage is in the range from 200 V to 1000 V. As a result of this dry etching, an upper striped region 39a is formed out of the active layer 34, second waveguide layer 35 and p-type cladding layer 36 in the striped-region-forming layer 37 to have a plane orientation (0–11) on the sides vertical to the substrate.

Figure 2D:
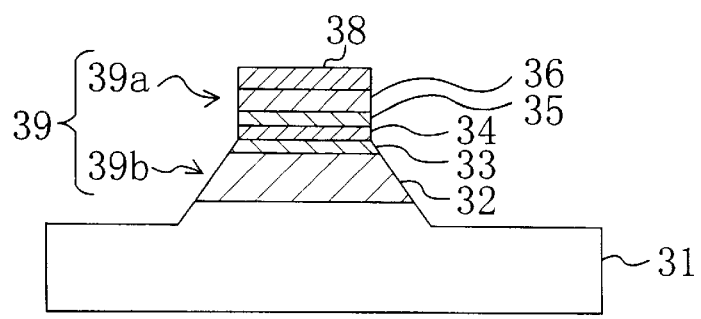

Then, as shown in FIG. 2(d), the remaining portion of the striped-region-forming layers 37 and part of the substrate 31 are wet-etched with an aqueous solution of hydrogen bromide (HBr), thereby exposing the upper part of the substrate. As a result, a lower striped region 39b is formed out of the n-type cladding layer 32 and the first waveguide layer 33 under the upper striped region 39a and along the sides of the upper striped region 39a so as to have sides with a plane orientation (1–11)B.

In this manner, a striped region 39, consisting of: the upper striped region 39a with a plane orientation (0–11) on the sides thereof; and the lower striped region 39b with a plane orientation (1–11)B on the sides thereof, is completed.

Figure 3A:
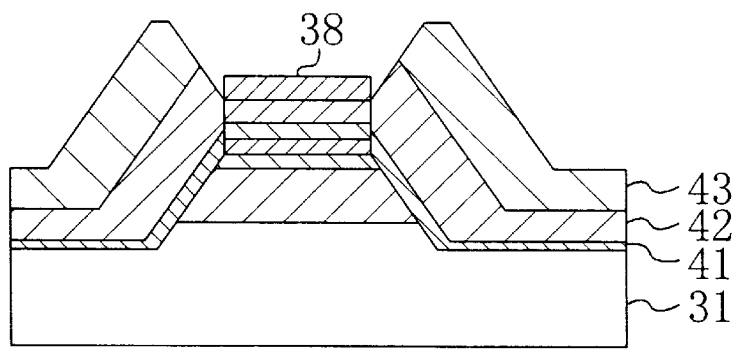
FIGS. 3(a) and 3(b) are cross-sectional views illustrating respective process steps for fabricating the buried heterostructure semiconductor laser device of the first embodiment.

Next, as shown in FIG. 3(a), undoped InP first burying layer 41, p-type InP second burying layer 42 and n-type InP third burying layer 43 are grown in this order over the substrate 31 by MOVPE, for example, with the mask pattern 38 left.

Figure 3B:
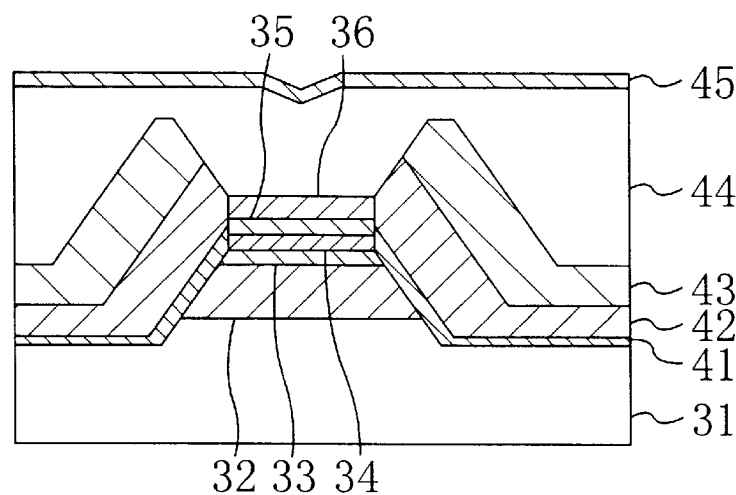

Then, as shown in FIG. 3(b), the mask pattern 38 is removed. And a p-type InP fourth burying layer 44 and a p-type InGaAs contact layer 45 are grown in this order by MOVPE over the entire upper surface of the third burying layer 43 and the p-type cladding layer 36. Finally, a p-side electrode is formed on the upper surface of the contact layer 45 by alternately stacking Pt, Ti and Pt layers by an evaporation technique. And an n-side electrode is formed on the back of the substrate 31 by alternately stacking Au and Sn layers by an evaporation technique. In this manner, the BH-LD shown in FIG. 1 is completed.

In this embodiment, an aqueous solution of HBr is used as an etchant for forming the lower striped region 39b. Alternatively, a mixed solution of HBr and hydrogen peroxide ($H_2O_2$) or a mixed solution of HBr and phosphoric acid ($H_3PO_4$) may also be used. Even in such a case, the sides of the lower striped region 39b can also be (1–11)B planes.

Embodiment 2

Hereinafter, a second exemplary embodiment of the present invention will be described with reference to the accompanying drawings.

Figure 4:
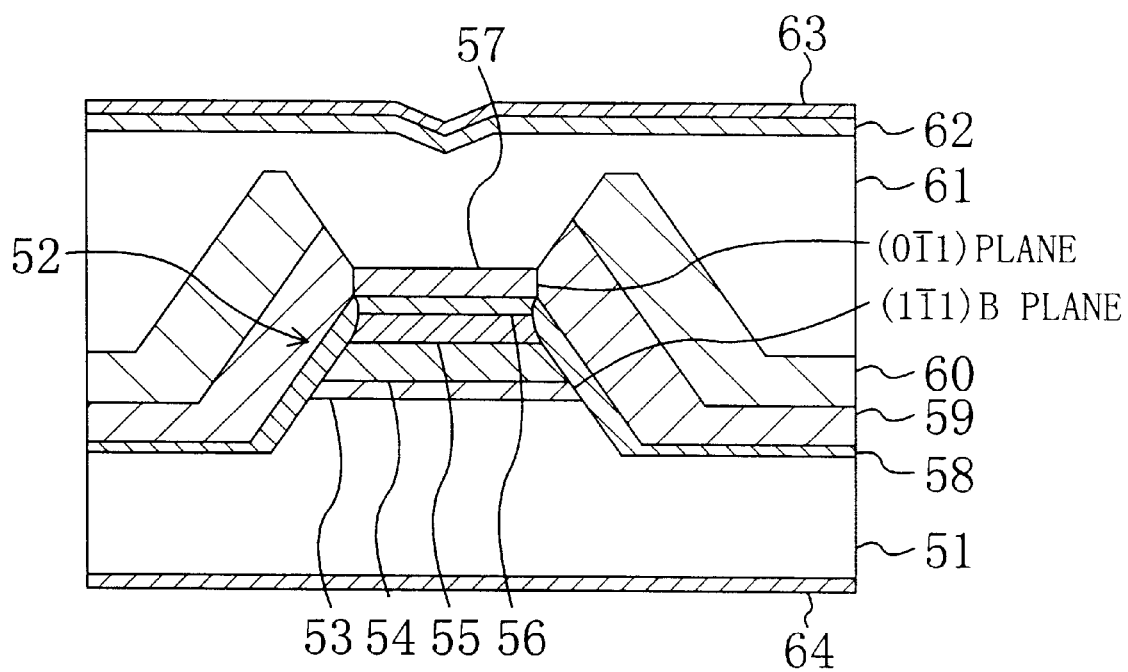
FIG. 4 is a cross-sectional view illustrating a structure of a buried heterostructure semiconductor laser device according to a second embodiment of the present invention.

FIG. 4 illustrates a cross-sectional structure of a buried heterostructure semiconductor laser device (BH-LD) according to the second embodiment of the present invention. As shown in FIG. 4, a striped region 52 with a convex cross section is formed as a laser resonant cavity on an n-type InP substrate 51.

The striped region 52 is formed along the zone axis, i.e., in the [011] direction. The striped region 52 is formed by stacking n-type InP cladding layer 53, n-type InGaAsP first waveguide layer 54, InGaAsP active layer 55, p-type InGaAsP second waveguide layer 56 and p-type InP cladding layer 57 in this order on the substrate 51. On both end facets of the striped region 52, crystals are cleaved.

The sides of the n-type cladding layer 53, first waveguide layer 54, active layer 55 and second waveguide layer 56 in the striped region 52 have a plane orientation approximately represented as (1–11)B or the vicinity thereof. The length of the striped region 52 is ordinarily in the range from 200 μm to 1.5 mm. The width of the striped region 52 is defined by the width of the active layer 55. If the active layer 55 is a multiple quantum well of InGaAsP, then the width of the striped region 52 is in the range from about 0.5 μm to about 2 μm. The height of the striped region 52 is ordinarily about 2 μm. If the active layer 55 is a multiple quantum well of InGaAsP, then the height of the striped region 52 is in the range from about 1.5 μm to about 3 μm.

The sides of the striped region 52 are sequentially buried with first, second and third burying layers 58, 59 and 60. The first burying layer 58 (i.e., the first semiconductor layer as defined in the claims) is made of p-type InP (doped with Zn at a concentration of about $0.3 \times 10^{18}$ $cm^{-3}$) with a thickness ranging from about 10 nm to about 0.5 μm. The second burying layer 59 (i.e., the second semiconductor layer as defined in the claims) is made of p-type InP (doped with Zn at a concentration of about $1.0 \times 10^{18}$ $cm^{-3}$) with a thickness ranging from about 0.5 μm to about 1 μm. And the third burying layer 60 is made of n-type InP (doped with Si, for example) with a thickness ranging from about 0.5 μm to about 1 μm.

The upper surface of the striped region 52, as well as the second and third burying layers 59 and 60, is entirely buried in a p-type InP fourth burying layer 61 with a thickness of about 2 μm. And a p-type InGaAs contact layer 62 with a thickness of about 0.5 μm is further deposited on the upper surface of the fourth burying layer 61.

A p-side electrode 63, in which plural pairs of Pt and Ti layers are alternately stacked, is formed on the upper surface of the contact layer 62. And an n-side electrode 64, in which plural pairs of Au and Sn layers are alternately stacked, is formed on the back of the substrate 51.

The sides of the striped region 52 are (1–11)B planes. Therefore, the first, second and third burying layers 58, 59 and 60 also grow on the sides of the striped region 52 in the [1–11]B direction.

In this embodiment, the p-type dopant also diffuses during a heat treatment for growing the burying layers. However, the sides of the active layer 55 and those of the first and second waveguide layers 54 and 56, sandwiching the active layer 55 in the direction vertical to the substrate 51, have a plane orientation (1–11)B. Accordingly, the p-type dopant, e.g., Zn, is less likely to diffuse inward from these sides of the striped region 52.

Furthermore, unlike the first embodiment, the first burying layer 58, closest to the n-type substrate 51, is of p-type and can block the n-type carriers, i.e., electrons, with more certainty. The diffusion rate of a dopant is proportional to the concentration of the dopant introduced into a burying layer. In this embodiment, since the dopant concentration in the first burying layer 58 is as low as about $0.3\times10^{18}$ cm$^{-3}$, the diffusion of Zn toward the striped region 52 can be minimized. Thus, the reliability of the device is not seriously affected in practice.

Since the dopant is less likely to diffuse from the first and second burying layers 58 and 59 toward the active layer 55, a BH-LD excellent in long-term reliability can be formed with a lot more certainty.

The first burying layer 58 may be doped at less than $0.3\times10^{18}$ cm$^{-3}$ or even undoped. In such a case, the thickness of the first burying layer 18 is preferably 0.5 μm or less.

Also, the first burying layer 58 may be made of n-type InP with a thickness of 0.5 μm or less. In such a case, the diffusion of the p-type dopant toward the active layer 55 can be further suppressed.

As another alternative, the first burying layer 58 may be made of n-type InP with a thickness of 0.5 μm or less, and the second burying layer 59 may have a two-layered structure consisting of: a p-type lightly doped layer, which is closer to the first burying layer 58; and a p-type heavily doped layer, which is closer to the third burying layer 60.

Moreover, since the sides of the striped region 52 are buried in the burying layers with a plane orientation (1–11)B, the first burying layer 58 may be either undoped or made of p-type InP, and the second burying layer 59 may be made of n-type InP.

Also, the sides of the striped region 52 may be not only (1–11)B planes, but any crystallographic planes with a plane orientation (2–11)B, (3–11)B, etc., which is defined between (1–11)B and (100).

Hereinafter, a method for fabricating the BH-LD with such a structure will be described with reference to FIGS. 5(a), 5(b), 5(c) and 5(d) and FIGS. 6(a), 6(b) and 6(c).

Figure 5A:
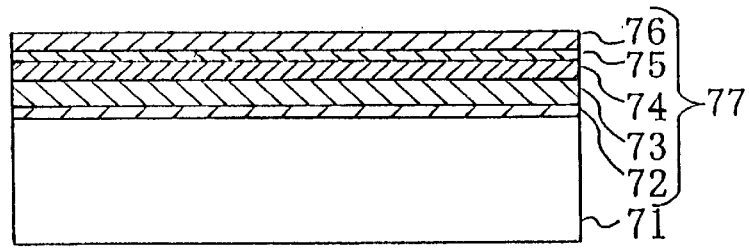
FIGS. 5(a), 5(b), 5(c) and 5(d) are cross-sectional views illustrating respective process steps for fabricating the buried heterostructure semiconductor laser device of the second embodiment.

FIGS. 5(a) through 5(d) and FIGS. 6(a) through 6(c) illustrate respective cross-sectional structures corresponding to the individual process steps for fabricating the BH-LD of the second embodiment. First, as shown in FIG. 5(a), n-type InP cladding layer 72, n-type InGaAsP first waveguide layer 73, InGaAsP active layer 74, p-type InGaAsP second waveguide layer 75 and p-type InP cladding layer 76 are grown in this order by MOVPE, for example, on the principal surface of an n-type InP substrate 71 with a plane orientation (100). As a result, striped-region-forming layers 77, consisting of the n-type cladding layer 72, first waveguide layer 73, active layer 74, second waveguide layer 75 and p-type cladding layer 76, are formed.

Figure 5B:
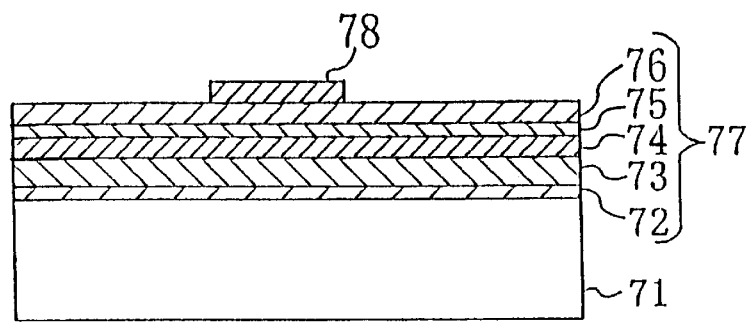

Next, as shown in FIG. 5(b), a mask pattern 78 made of a dielectric such as $SiO_2$ with a plurality of stripes extending along the zone axis, or in the [011] direction, is selectively formed on the upper surface of the striped-region-forming layers 77.

Figure 5C:
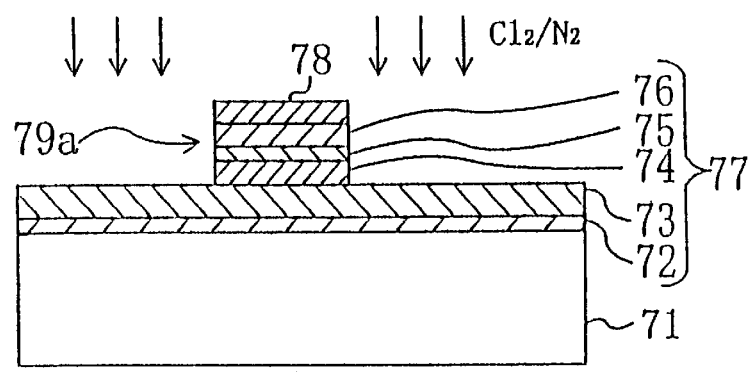

Subsequently, as shown in FIG. 5(c), the striped-region-forming layers 77 are subjected to a reactive ion etching (RIE) process using the mask pattern 78, thereby exposing the first waveguide layer 73 out of the striped-region-forming layers 77. The RIE process is performed under the conditions that the flow rate ratio of $Cl_2$ gas to $N_2$ gas is 3:1, the pressure is in the range from 1 mTorr to 2 mTorr and the accelerating voltage is in the range from 200 V to 1000 V.

As a result of this dry etching, an upper-stripe-forming region 79a is formed out of the active layer 74, second waveguide layer 75 and p-type cladding layer 76 in the striped-region-forming layers 77 to have a plane orientation (0–11) on the sides thereof vertical to the substrate.

Figure 5D:
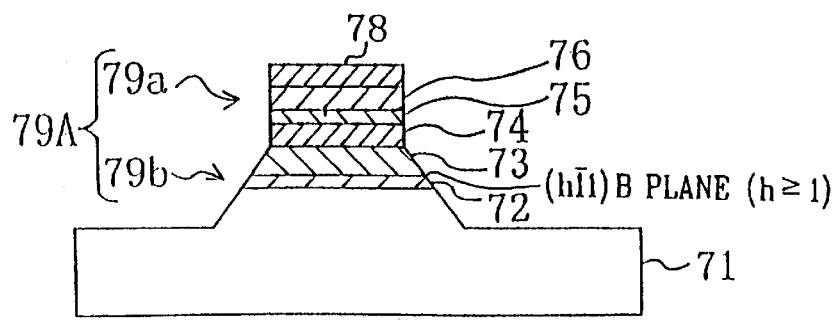

Then, as shown in FIG. 5(d), the remaining portion of the striped-region-forming layers 77 and part of the substrate 71 are wet-etched with an aqueous solution of HBr, thereby exposing the upper part of the substrate 71. As a result, a lower-stripe-forming region 79b is formed out of the n-type cladding layer 72 and the first waveguide layer 73 under the upper-stripe-forming region 79a and along the sides of the upper-stripe-forming region 79a to have a plane orientation (1–11)B on the sides thereof.

In this manner, a stripe-forming region 79A, consisting of: the upper-stripe-forming region 79a with a plane orientation (0–11) on the sides thereof; and the lower-stripe-forming region 79b with a plane orientation (1–11)B on the sides thereof, is obtained.

Figure 6A:
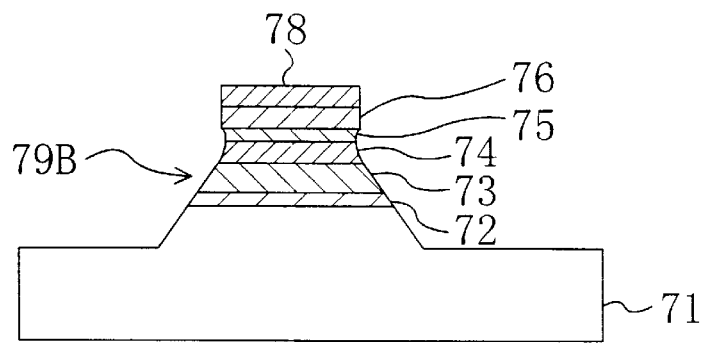
FIGS. 6(a), 6(b) and 6(c) are cross-sectional views illustrating respective process steps for fabricating the buried heterostructure semiconductor laser device of the second embodiment.

Next, as shown in FIG. 6(a), the stripe-forming region 79A is wet-etched with a mixed solution of sulfuric acid ($H_2SO_4$), hydrogen peroxide ($H_2O_2$) and pure water ($H_2O$) for 30 seconds to 2 minutes with the mask pattern 78 left on the upper surface of the stripe-forming region 79A. This mixed solution selectively etches semiconductor layers made of InGaAsP. Thus, the first waveguide layer 73, the active layer 74 and the second waveguide layer 75 are selectively etched by this solution in the stripe-forming region 79A. When this wet etching is performed with the mixed solution of $H_2SO_4$, $H_2O_2$ and $H_2O$, a striped region 79B is formed to have a plane orientation (1–11)B on the sides thereof, because the longer axis of the stripe-forming region 79A is in the [011] direction.

Figure 6B:
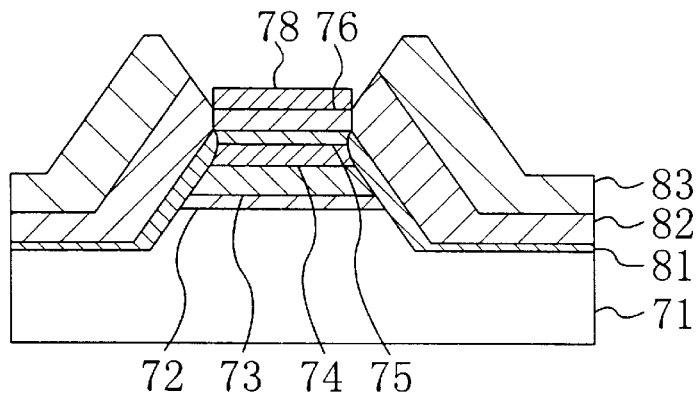

Next, as shown in FIG. 6(b), p-type InP lightly-doped first burying layer 81, p-type InP second burying layer 82 and n-type InP third burying layer 83 are grown in this order over the substrate 71 by MOVPE, for example, with the mask pattern 78 left.

Figure 6C:
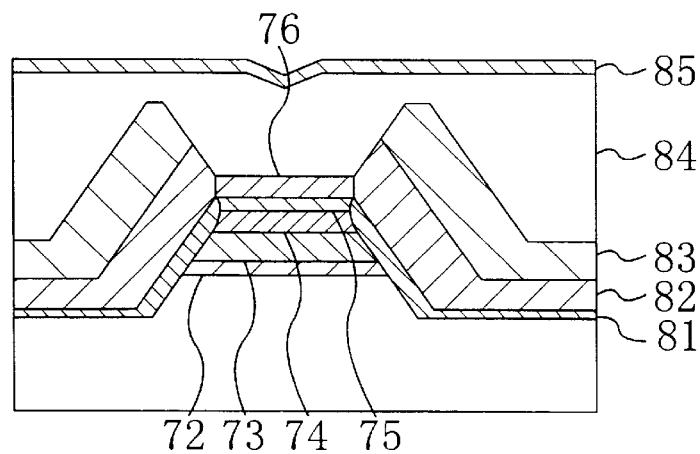
Figure 7:
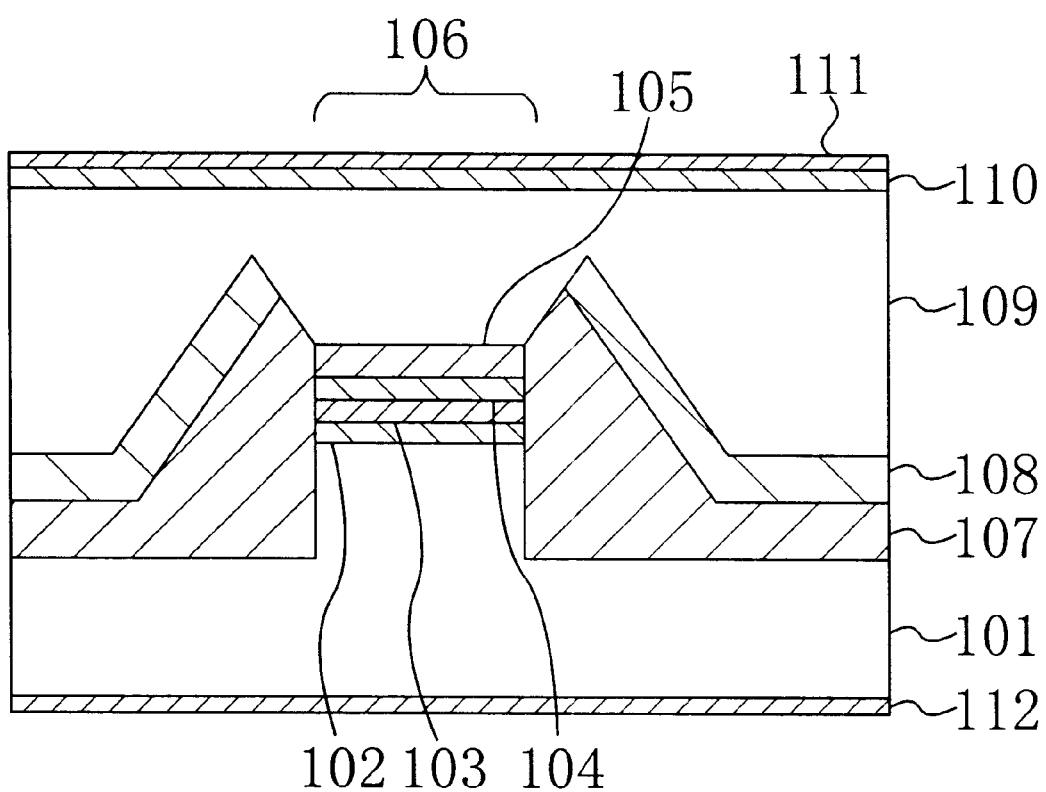
FIG. 7 is a cross-sectional view illustrating a structure of a conventional buried heterostructure semiconductor laser device.

Then, as shown in FIG. 6(c), the mask pattern 78 is removed. And a p-type InP fourth burying layer 84 and a p-type InGaAs contact layer 85 are grown in this order over the entire upper surface of the third burying layer 83 and the p-type cladding layer 76 by MOVPE. Thereafter, a p-side electrode is formed on the upper surface of the contact layer 85 by alternately stacking Pt, Ti and Pt layers by an evaporation technique. And an n-side electrode is formed on the back of the substrate 71 by alternately stacking Au and Sn layers by an evaporation technique. In this manner, the BH-LD shown in FIG. 4 is completed.

In this embodiment, an aqueous solution of HBr is used as an etchant for forming the lower-stripe-forming region 79b. Alternatively, a mixed solution of HBr and hydrogen peroxide ($H_2O_2$) or a mixed solution of HBr and phosphoric acid ($H_3PO_4$) may also be used. Even in such a case, the sides of the lower-stripe-forming region 79b can also be (1–11)B planes.

What is claimed is:

1. A semiconductor laser device comprising:
    a first waveguide layer, an active layer, a second waveguide layer, and
    a striped region, which is formed on a substrate and comprises lower and upper striped regions, wherein the lower striped region comprises the first waveguide layer, and the upper striped region comprises the active layer and the second waveguide layer formed on the active layer; and a plurality of burying semiconductor layers formed on the sides and upper surface of the striped region, wherein at least one of the burying semiconductor layers is doped with zinc, and wherein the sides of the upper striped region have a plane orientation approximately represented as (0–11) and the sides of the lower striped region have a plane orientation approximately represented as (h–11)B, where h is an integer equal to or larger than 1.

2. The device of claim 1, wherein a region under the striped region is of a first conductivity type, and wherein the burying layers include first and second semiconductor layers, which are formed in this order on the sides of the striped region, the first semiconductor layer being undoped, the second semiconductor layer being of a second conductivity type.

3. The device of claim 2, wherein a dopant concentration in the second semiconductor layer has such a profile that a concentration in a region of the second semiconductor layer is lower than a concentration in another region of the second semiconductor layer, the former region being closer to the first semiconductor layer than the latter region.

4. The device of claim 1, wherein a region under the striped region is of a first conductivity type, and wherein the burying layers include first and second semiconductor layers, which are formed in this order on the sides of the striped region, the first semiconductor layer being undoped, the second semiconductor layer being of the first conductivity type.

5. The device of claim 1, wherein a region under the striped region is of a first conductivity type, and wherein the burying layers include first and second semiconductor layers, which are formed in this order on the sides of the striped region, the first semiconductor layer being of a second conductivity type, the second semiconductor layer being of the first conductivity type.

6. The device of claim 1, wherein a region under the striped region is of a first conductivity type, and wherein the burying layers include first and second semiconductor layers, which are formed in this order on the sides of the striped region, the first semiconductor layer being of the first conductivity type, the second semiconductor layer being of a second conductivity type.

7. The device of claim 1, wherein a region under the striped region is of a first conductivity type, and wherein the burying layers include first and second semiconductor layers, which are formed in this order on the sides of the striped region, the first and second semiconductor layers being of a second conductivity type, the first semiconductor layer having a dopant concentration lower than that of the second semiconductor layer.

8. The device of claim 1, wherein the upper striped region is formed by dry-etching, and the lower striped region is formed by wet-etching.

9. A semiconductor laser device comprising:

a first waveguide layer, an active layer, a second waveguide layer, and a striped region, which is formed on a substrate and comprises lower and upper striped regions, wherein the lower striped region comprises the first waveguide layer, and the upper striped region comprises the active layer and the second waveguide layer formed on the active layer; and a plurality of burying semiconductor layers formed on the sides and upper surface of the striped region, wherein at least one of the burying semiconductor layers is doped with zinc, and wherein the sides of the upper striped region have a plane orientation approximately represented as (h–11)B, where h is an integer larger than 1, and wherein the sides of the lower striped region have a plane orientation approximately represented as (j–11)B, where j is an integer larger than 1 and h.

10. The device of claim 9, wherein a region under the striped region is of a first conductivity type, and wherein the burying layers include first and second semiconductor layers, which are formed in this order on the sides of the striped region, the first semiconductor layer being undoped, the second semiconductor layer being of a second conductivity type.

11. The device of claim 10, wherein a dopant concentration in the second semiconductor layer has such a profile that a concentration in a region of the second semiconductor layer is lower than a concentration in another region of the second semiconductor layer, the former region being closer to the first semiconductor layer than the latter region.

12. The device of claim 9, wherein a region under the striped region is of a first conductivity type, and wherein the burying layers include first and second semiconductor layers, which are formed in this order on the sides of the striped region, the first semiconductor layer being undoped, the second semiconductor layer being of the first conductivity type.

13. The device of claim 9, wherein a region under the striped region is of a first conductivity type, and wherein the burying layers include first and second semiconductor layers, which are formed in this order on the sides of the striped region, the first semiconductor layer being of a second conductivity type, the second semiconductor layer being of the first conductivity type.

14. The device of claim 9, wherein a region under the striped region is of a first conductivity type, and wherein the burying layers include first and second semiconductor layers, which are formed in this order on the sides of the striped region, the first semiconductor layer being of the first conductivity type, the second semiconductor layer being of a second conductivity type.

15. The device of claim 9, wherein a region under the striped region is of a first conductivity type, and wherein the burying layers include first and second semiconductor layers, which are formed in this order on the sides of the striped region, the first and second semiconductor layers being of a second conductivity type, the first semiconductor layer having a dopant concentration lower than that of the second semiconductor layer.

16. The device of claim 9, wherein the upper striped region is formed by dry-etching, and the lower striped region is formed by wet-etching.

* * * * *

UNITED STATES PATENT AND TRADEMARK OFFICE
CERTIFICATE OF CORRECTION

PATENT NO.    : 6,449,298 B1
DATED         : September 10, 2002
INVENTOR(S)   : Toyoji Chino et al.

It is certified that error appears in the above-identified patent and that said Letters Patent is hereby corrected as shown below:

<u>Title page,</u>
Item [75], Inventors, delete "Toshiyuki Tarizawa" add -- Toshiyuki Takizawa --.

<u>Drawings,</u>
Sheet 1, Fig. 1, delete " $(1\bar{1}1)$ B PLANE" add -- $(h\bar{1}1)$ B PLANE $(h \geq 1)$ --.

Sheet 2, Fig. 2(d), add -- $(h\bar{1}1)$ B PLANE $(h \geq 1)$ --.

Sheet 3, Fig. 3(a), add -- $(h\bar{1}1)$ B PLANE $(h \geq 1)$ --.

Sheet 3, Fig. 3(b), add -- $(h\bar{1}1)$ B PLANE $(h \geq 1)$ --.

Sheet 4, Fig. 4, delete " $(1\bar{1}1)$ B PLANE" add -- $(h\bar{1}1)$ B PLANE $(h \geq 1)$ --.

Sheet 6, Fig. 6(a), add -- $(h\bar{1}1)$ B PLANE $(h \geq 1)$ --.

Sheet 6, Fig. 6(b), add -- $(h\bar{1}1)$ B PLANE $(h \geq 1)$ --.

Sheet 6, Fig. 6(c), add -- $(h\bar{1}1)$ B PLANE $(h \geq 1)$ --.

Figure 8:
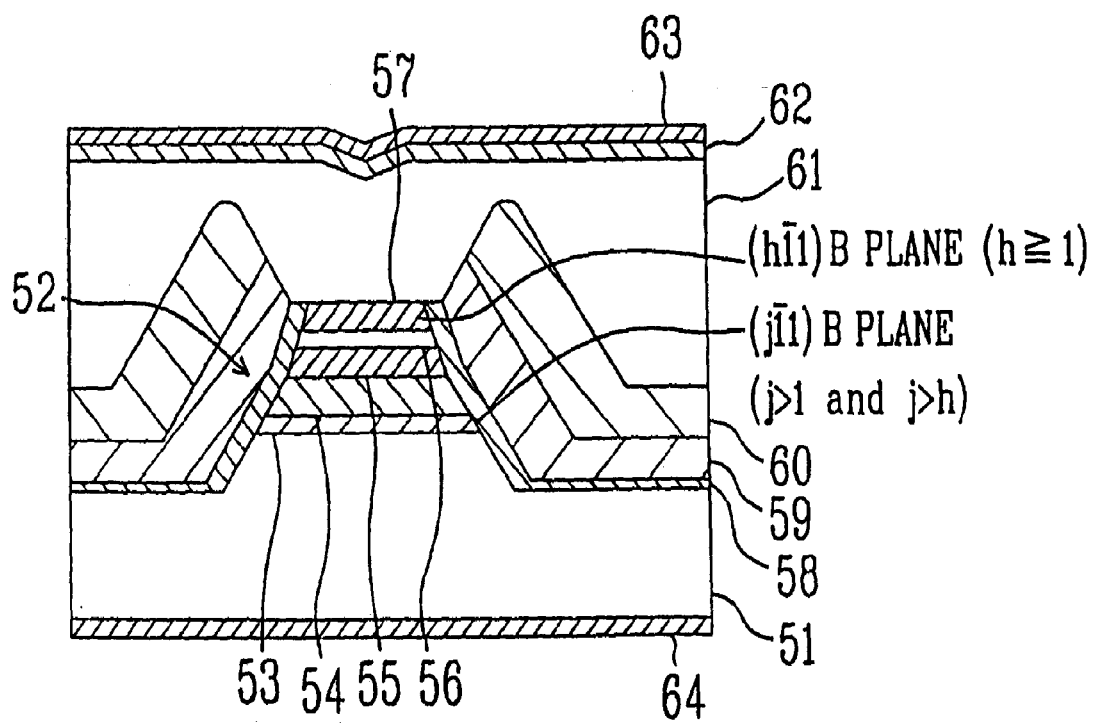
FIG. 8 is another a cross-sectional view illustrating a structure of a buried heterostructure semiconductor laser device according to a second embodiment of the present invention.

The single drawing sheet consisting of Figure 8, should be added as shown on the attached sheet.

Delete number on drawing sheets 1 of 7- 7 of 7 to be renumbered sheets sheets as 1 of 8 – 8 of 8.

Signed and Sealed this

Twenty-ninth Day of April, 2003

JAMES E. ROGAN
*Director of the United States Patent and Trademark Office*